United States Patent
Jung et al.

(10) Patent No.: US 8,655,806 B2
(45) Date of Patent: Feb. 18, 2014

(54) DISASTER ANALYSIS AND DECISION SYSTEM

(76) Inventors: Sungeun Jung, Irvine, CA (US);
Yoonrak Hwang, Seoul (KR); Dong Seop Lee, Seoul (KR); Sang Suk Lee, Incheon (KR)

( * ) Notice: Subject to any disclaimer, the term of this patent is extended or adjusted under 35 U.S.C. 154(b) by 429 days.

(21) Appl. No.: 12/964,718

(22) Filed: Dec. 9, 2010

(65) Prior Publication Data

US 2012/0150783 A1 Jun. 14, 2012

(51) Int. Cl.
*G06F 15/18* (2006.01)
*G06G 7/48* (2006.01)
*G06N 99/00* (2010.01)
*G06F 17/50* (2006.01)

(52) U.S. Cl.
CPC .......... *G06N 99/005* (2013.01); *G06F 17/5009* (2013.01)
USPC ................................. 706/12; 703/6

(58) Field of Classification Search
None
See application file for complete search history.

(56) References Cited

U.S. PATENT DOCUMENTS

| | | | | |
|---|---|---|---|---|
| 5,808,916 | A * | 9/1998 | Orr et al. | 703/6 |
| 5,831,876 | A * | 11/1998 | Orr et al. | 703/6 |
| 5,835,386 | A * | 11/1998 | Orr et al. | 703/2 |
| 7,634,361 | B2 * | 12/2009 | Levesque et al. | 702/19 |
| 2010/0100510 | A1 * | 4/2010 | Balaban et al. | 706/12 |

* cited by examiner

*Primary Examiner* — Alan Chen
(74) *Attorney, Agent, or Firm* — Chanmin Park

(57) ABSTRACT

A disaster analysis and decision system comprises a geographic area module that comprises geographic data for a given geographic area; an artificial facilities module that comprises artificial facilities data positioned in the geographic area; a disaster control facilities module that comprises disaster control facilities data for the geographic area; an environmental variable module that receives and stores environmental variables that affects the geographic area; an analysis module that analyzes how the environmental variables affect the geographic area, the artificial facilities within the geographic area and the disaster control facilities for the geographic area, and decides how to control the disaster control facilities; a report module that provides reports for the analysis; and a database that stores data from other modules.

25 Claims, 2 Drawing Sheets

DISASTER ANALYSIS AND DECISION SYSTEM

BACKGROUND OF THE INVENTION

The invention is related to a disaster analysis and decision system. More particularly, the invention is related to a disaster analysis and decision system that integrates latest technological disaster analysis tools.

Due to global climate change, intensity of precipitation and wind are becoming strong, that causes the level of damages to rise year by year. In addition, developments by human being including large artificial structures and population concentration cause localized concentration of precipitation, extreme temperature and wind, and locally amplified damages. People also expect more localized and more precise disaster prediction and control measures. Numerous researches and developments have been performed for better understanding of and coping with disasters have performed. However, such efforts and achievements have not been effectively incorporated into a nationwide coordination system due to technological, administrative barriers, etc. A system effectively integrating latest disaster analysis and decision means has long been in need.

SUMMARY OF THE INVENTION

An objective of the invention is to provide a disaster analysis and decision system that can provide fast and accurate disaster analysis and decision.

Another objective of the invention is to provide a disaster analysis and decision system that provides total monitoring, recording and analyzing of all available information.

To achieve the above objectives, the present invention provides a disaster analysis and decision system that comprises a geographic area module that comprises geographic data for a given geographic area; an artificial facilities module that comprises artificial facilities data positioned in the geographic area; a disaster control facilities module that comprises disaster control facilities data for the geographic area; an environmental variable module that receives and stores environmental variables that affects the geographic area; an analysis module that analyzes how the environmental variables affect the geographic area, the artificial facilities within the geographic area and the disaster control facilities for the geographic area, and decides how to control the disaster control facilities; a report module that provides reports for the analysis; and a database that stores data from the geographic area module, the artificial facilities module, the disaster control facilities module, the environmental variable module, the analysis module and the report module.

The environmental variable comprises precipitation and wind over a specific portion of the geographic area.

The analysis module handles data from the geographic module, the artificial facilities module, the disaster control facilities module and/or the environmental variable module, wherein the analysis module compensates the data statistically whereby the influence of faulty data included in the data is eliminated.

The analysis module compensates the data with reference to feedback from the geographic module, the artificial facilities module, the disaster control facilities module and/or the environmental variable module.

The faulty data compensated by the analysis module include sensor disorder, actuator disorder, human error, and wrong data input.

The disaster control facilities data includes data for drain pump capacity and opening flood gates. The decision to control the disaster control facilities includes operation commands for drain pumps and flood gates.

The analysis module allocates drainage capacity based on analysis of data from the geographic module, the artificial facilities module, the disaster control facilities module and/or the environmental variable module.

The analysis module calculates water level change along the time for a given area based on the geographic data around the given area, wherein the analysis module calculates expected damages for the artificial facilities for a given area based on the calculated water level change and the artificial facilities data, wherein the analysis module decides allocation for drainage capacity to minimize the damages for the artificial facilities.

The analysis module calculates damage area according to degree of flood.

The analysis module organizes statistical disaster data for a given unit area and constructs a disaster data map for a given area based on the data stored in the database.

The analysis module decides issuance of disaster alarms and recommended prevention measures for disaster based on the latest data for a given area and areas adjacent to the given area.

The analysis module monitors the environmental variable and predicts damages to the artificial facilities according to the change of the environmental variable for a given area.

The environmental variable comprises precipitation and the damage comprises inundated area.

The analysis module analyzes local disaster vulnerability based on based on analysis of data from the geographic module, the artificial facilities module, the disaster control facilities module and/or the environmental variable module.

The geographic module utilizes GIS, wherein the analysis module analyzes local disaster vulnerability within predetermined percentage probability radius for hurricane path. The predetermined percentage is 70%.

The analysis module performs rainfall rate contour analysis when there is a precipitation convergence zone.

The analysis module analyzes risky area into which precipitation is concentrated based on accumulated precipitation within specified period and specified local area.

The analysis module analyzes wind and/or water damage vulnerability based on GIS.

The analysis module evaluates local disaster vulnerability with real time weather situation per natural disaster type, which comprises hurricane, heavy rainfall and snowfall, and human population density, geography, financial value, and past damage data, and decides special manage area per risky area with vulnerability evaluation.

The analysis module estimates current status of a river and upstreams of the river according to water level rise of the river with the geographic data.

The report module shows hurricane course status, wherein the analysis module compares adjacent country's hurricane path, establishes a scenario, and analyzes similar hurricane, wherein the analysis module analyzes vulnerability of an area within the hurricane path, wherein the report module constructs a detail screen for city or other administrative regions.

The operations of the report module and the analysis module are based on the data from the geographic module, the artificial facilities module, the disaster control facilities module and/or the environmental variable module. The operations are provided for a hurricane monitor area which is 16-25 degree front of the hurricane path or for a hurricane alert area which is 25-28 degree front of the hurricane path.

The advantageous effects of the present invention are numerous. First, in the disaster prediction stage, the system can analyze damages according to certain civil engineering projects; review influences according to disaster facilities maintenance and fixing; establish selective defense plan by analyzing vulnerable areas and analyze priority investment for disaster prevention projects. Second, in the disaster managing stage, the system can prepare in advance or respond on site with analysis of situation scenarios; prepare and cope with analysis of specially monitored areas; provide information required for decision for inundation prediction and resident evacuation. Third, in the recovery stage from disaster, the system can support information for effectiveness evaluation for disaster recovery actions; provide simulated evaluation for effects after completion of recovery works. Finally, as feedback the system can provide information for properness and effectiveness for each level of disaster prevention and emergency coping plan; evaluate coping process and calculate wind and flood disaster insurance premium rate; and provide disaster prevention standard considering environmental change due to disaster.

BRIEF DESCRIPTION OF DRAWINGS

The present invention will become better understood with reference to the accompanying drawings, wherein.

DETAILED DESCRIPTION OF THE INVENTION

Figure 1:
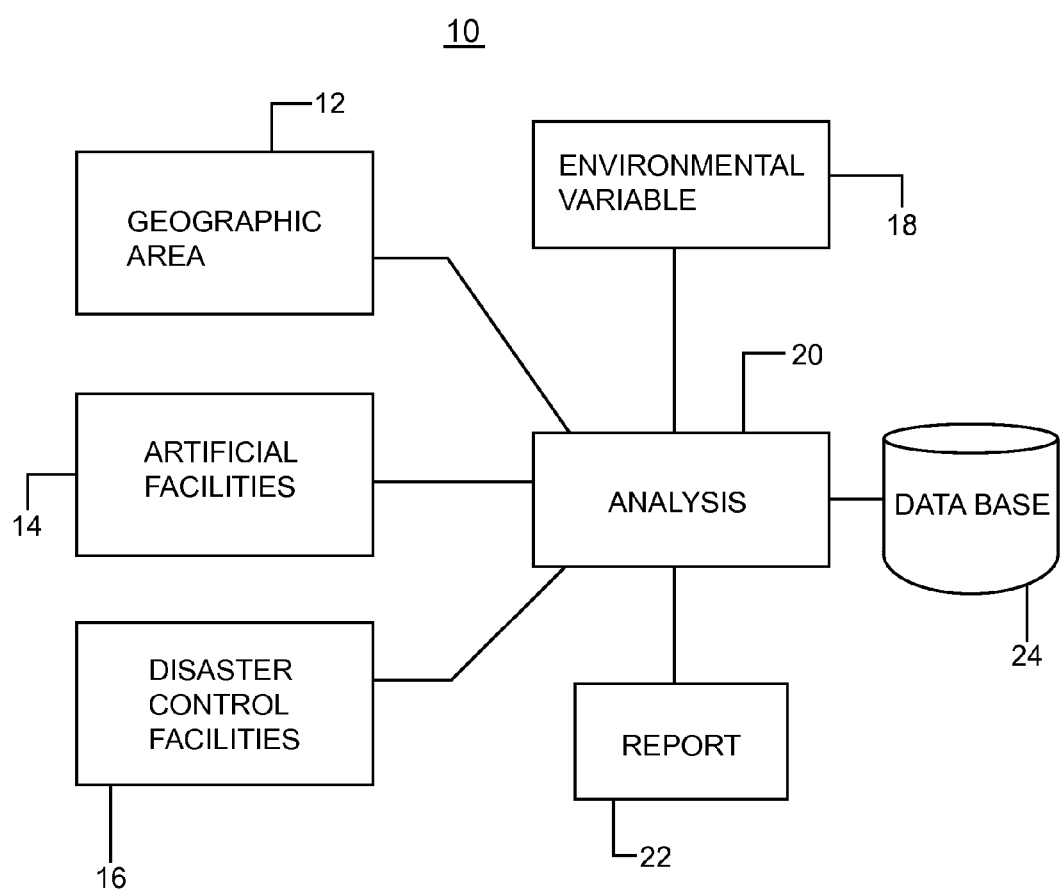
FIG. 1 is a block diagram showing a disaster analysis and decision system according to the present invention.

FIG. 1 shows a disaster analysis and decision system 10 that comprises a geographic area module 12 that comprises geographic data for a given geographic area; an artificial facilities module 14 that comprises artificial facilities data positioned in the geographic area; a disaster control facilities module 16 that comprises disaster control facilities data for the geographic area; an environmental variable module 18 that receives and stores environmental variables that affects the geographic area; an analysis module 20 that analyzes how the environmental variables affect the geographic area, the artificial facilities within the geographic area and the disaster control facilities for the geographic area, and decides how to control the disaster control facilities; a report module 22 that provides reports for the analysis; and a database 24 that stores data from the geographic area module 12, the artificial facilities module 14, the disaster control facilities module 16, the environmental variable module 18, the analysis module 20 and the report module 22.

The environmental variable comprises precipitation and wind over a specific portion of the geographic area.

Figure 2:
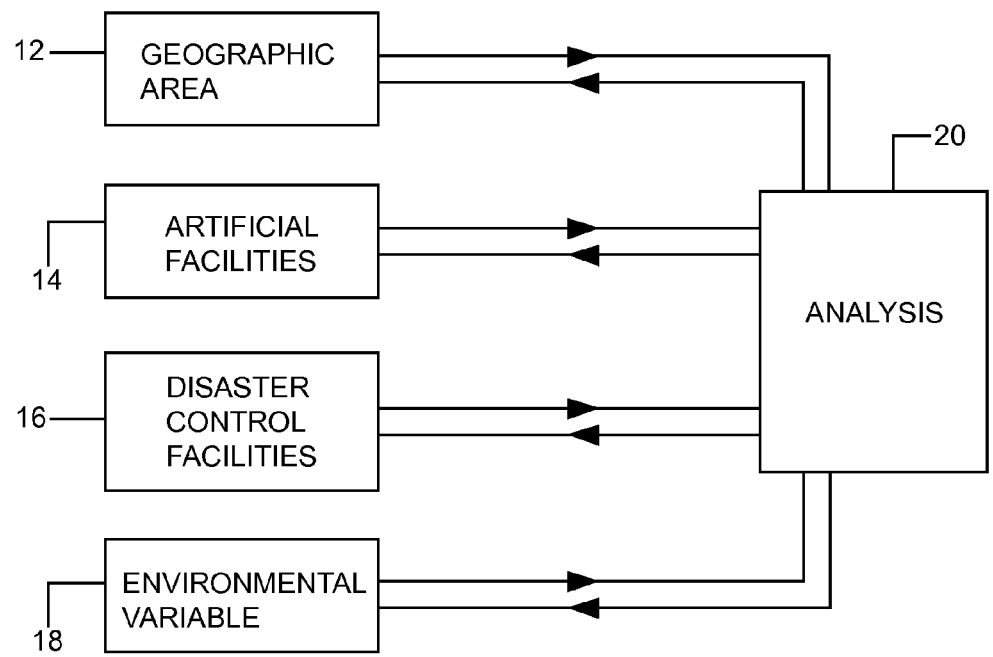
FIG. 2 is a block diagram showing erroneous data compensation scheme.

FIG. 2 shows that the analysis module 20 handles data from the geographic module 12, the artificial facilities module 14, the disaster control facilities module 16 and/or the environmental variable module 18. The analysis module compensates the data statistically whereby the influence of faulty data included in the data is eliminated.

The analysis module 20 compensates the data with reference to feedback from the geographic module 12, the artificial facilities module 14, the disaster control facilities module 16 and/or the environmental variable module 18.

The faulty data compensated by the analysis module 20 include sensor disorder, actuator disorder, human error, and wrong data input. The influences of such faulty data are statistically compensated. Faulty data always exist and the system of the present invention statistically compensates the overall operating rate of disaster control facilities for a given area by reducing the rate to cover influence of faulty data. The statistical compensation is always updated by the feedback of the modules 12, 14, 16, 18.

Figure 3:
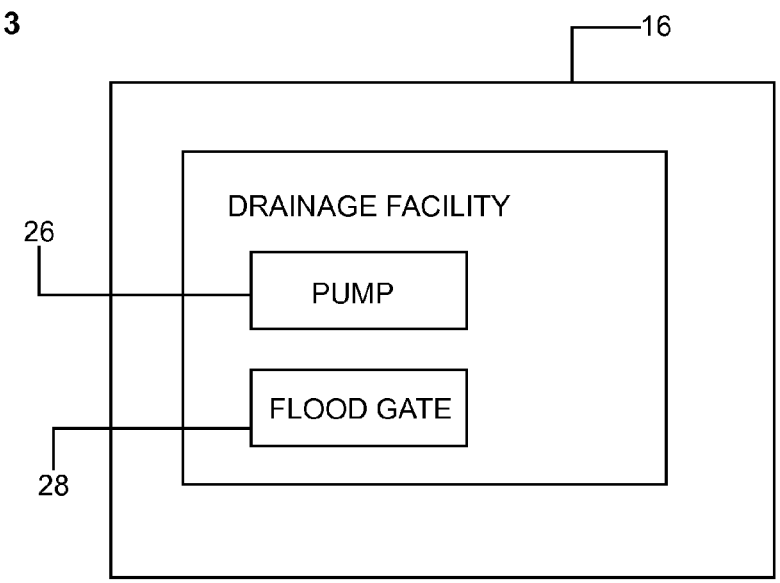
FIG. 3 is a block diagram showing a disaster control facilities module.

FIG. 3 shows that the disaster control facilities data includes data for drain pump 26 capacity and opening flood gates 28. The decision to control the disaster control facilities by the analysis module 20 includes operation commands for drain pumps 26 and flood gates 28.

The analysis module 20 allocates drainage capacity based on analysis of data from the geographic module 12, the artificial facilities module 14, the disaster control facilities module 16 and/or the environmental variable module 18.

The analysis module 20 calculates water level change along the time for a given area based on the geographic data around the given area. The analysis module 20 calculates expected damages for the artificial facilities for a given area based on the calculated water level change and the artificial facilities data. The analysis module 20 decides allocation for drainage capacity to minimize the damages for the artificial facilities. The damage may be evaluated considering different economic values of the artificial facilities influenced by the disaster.

The analysis module 20 calculates damage area according to degree of flood, for example, 10%, 20%, or 30%.

The analysis module 20 organizes statistical disaster data for a given unit area and constructs a disaster data map for a given area based on the data stored in the database. Such disaster data map may be used to calculate insurance premium for different areas.

The analysis module 20 decides issuance of disaster alarms and recommended prevention measures for disaster based on the latest data for a given area and areas adjacent to the given area. The proximities of time and distance provide more accurate result.

The analysis module 20 monitors the environmental variable and predicts damages to the artificial facilities according to the change of the environmental variable for a given area. The environmental variable comprises precipitation and the damage comprises inundated area.

The system of the present invention monitors storms or hurricanes, predicts river flood and inundated land, predicts main river flood water level and calculates expected inundated area. Total monitoring of disaster related information including water level of dam and main rivers is possible. The report provided by the report module 22 includes weather diagram and precipitation prediction diagram.

The analysis module 20 generates virtual scenario with user input of longitude and latitude and the report module 22 provides graphic draw of a hurricane path.

The analysis module 20 analyzes local disaster vulnerability based on analysis of data from the geographic module, the artificial facilities module, the disaster control facilities module and/or the environmental variable module.

The geographic module 12 utilizes GIS. The analysis module 20 analyzes local disaster vulnerability within predetermined percentage probability radius for hurricane path. The predetermined percentage is 70%.

The analysis module 20 performs rainfall rate contour analysis when there is a precipitation convergence zone.

The analysis module 20 analyzes risky area into which precipitation is concentrated based on accumulated precipitation within specified period and specified local area.

The analysis module 20 analyzes wind and/or water damage vulnerability based on GIS.

The analysis module 20 evaluates local disaster vulnerability with real time weather situation per natural disaster type, which comprises hurricane, heavy rainfall and snowfall, and human population density, geography, financial value, and past damage data, and decides special manage area per risky area with vulnerability evaluation.

The analysis module 20 estimates current status of a river and upstreams of the river according to water level rise of the river with the geographic data.

The report module 22 shows hurricane course status. The analysis module 20 compares adjacent country's hurricane path, establishes a scenario, and analyzes similar hurricane. The analysis module 20 analyzes vulnerability of an area within the hurricane path. The report module 22 constructs a detail screen for city or other administrative regions.

The operations of the report module 22 and the analysis module 20 are based on the data from the geographic module 12, the artificial facilities module 14, the disaster control facilities module 16 and/or the environmental variable module 18. The operations are provided for a hurricane monitor area which is 16-25 degree front of the hurricane path or for a hurricane alert area which is 25-28 degree front of the hurricane path.

Various aspects of the system's operations and related factors are additionally explained. Problems related artificial drainage facility includes insufficient drain pump capacity, malfunction thereof, and sewage backflow. Solutions for disaster control are different depending whether a drainage facility is open channel type or pipe type. Examples of artificial facilities include fish farms and agricultural fields. Some facility has higher economic impact than other facilities. Water level prediction is performed for main monitored points according to river water level change at important points. The variables to calculate and graphically display predicted flood area include predicted water level of main rivers and their specifications (section for specific locations, flood water level, levee height), GIS (Geographic information systems) and DEM (digital elevation model).

The invention claimed is:

1. A disaster analysis and decision system comprising an electronic device, wherein the electronic device comprises:
   a) a geographic area module that comprises geographic data for a given geographic area;
   b) an artificial facilities module that comprises artificial facilities data positioned in the geographic area;
   c) a disaster control facilities module that comprises disaster control facilities data for the geographic area;
   d) an environmental variable module that receives and stores environmental variables that affects the geographic area;
   e) an analysis module that analyzes how the environmental variables affect the geographic area, the artificial facilities within the geographic area and the disaster control facilities for the geographic area, and decides how to control the disaster control facilities;
   f) a report module that provides reports for the analysis; and
   g) a database that stores data from the geographic area module, the artificial facilities module, the disaster control facilities module, the environmental variable module, the analysis module and the report module.

2. The disaster analysis and decision system of claim 1, wherein the environmental variable comprises precipitation and wind over a specific portion of the geographic area.

3. The disaster analysis and decision system of claim 2, wherein the analysis module handles data from the geographic module, the artificial facilities module, the disaster control facilities module and/or the environmental variable module, wherein the analysis module compensates the data statistically whereby the influence of faulty data included in the data is eliminated.

4. The disaster analysis and decision system of claim 3, wherein the analysis module compensates the data with reference to feedback from the geographic module, the artificial facilities module, the disaster control facilities module and/or the environmental variable module.

5. The disaster analysis and decision system of claim 4, wherein the faulty data compensated by the analysis module include sensor disorder, actuator disorder, human error, and wrong data input.

6. The disaster analysis and decision system of claim 1, wherein the disaster control facilities data includes data for drain pump capacity and opening flood gates.

7. The disaster analysis and decision system of claim 6, wherein the decision to control the disaster control facilities includes operation commands for drain pumps and flood gates.

8. The disaster analysis and decision system of claim 1, wherein the analysis module allocate drainage capacity based on analysis of data from the geographic module, the artificial facilities module, the disaster control facilities module and/or the environmental variable module.

9. The disaster analysis and decision system of claim 8, wherein the analysis module calculates water level change along the time for a given area based on the geographic data around the given area, wherein the analysis module calculates expected damages for the artificial facilities for a given area based on the calculated water level change and the artificial facilities data, wherein the analysis module decides allocation for drainage capacity to minimize the damages for the artificial facilities.

10. The disaster analysis and decision system of claim 9, wherein the analysis module calculates damage area according to degree of flood.

11. The disaster analysis and decision system of claim 1, wherein the analysis module organizes statistical disaster data for a given unit area and constructs a disaster data map for a given area based on the data stored in the database.

12. The disaster analysis and decision system of claim 1, wherein the analysis module decides issuance of disaster alarms and recommended prevention measures for disaster based on the latest data for a given area and areas adjacent to the given area.

13. The disaster analysis and decision system of claim 1, wherein the analysis module monitors the environmental variable and predicts damages to the artificial facilities according to the change of the environmental variable for a given area.

14. The disaster analysis and decision system of claim 12, wherein the environmental variable comprises precipitation and the damage comprises inundated area.

15. The disaster analysis and decision system of claim 1, wherein the analysis module analyzes local disaster vulnerability based on based on analysis of data from the geographic module, the artificial facilities module, the disaster control facilities module and/or the environmental variable module.

16. The disaster analysis and decision system of claim 15, wherein the geographic module utilizes GIS, wherein the analysis module analyzes local disaster vulnerability within predetermined percentage probability radius for hurricane path.

17. The disaster analysis and decision system of claim 16, wherein the predetermined percentage is 70%.

18. The disaster analysis and decision system of claim 1, wherein the analysis module performs rainfall rate contour analysis when there is a precipitation convergence zone.

19. The disaster analysis and decision system of claim 18, wherein the analysis module analyzes risky area into which precipitation is concentrated based on accumulated precipitation within specified period and specified local area.

20. The disaster analysis and decision system of claim 1, wherein the analysis module analyzes wind and/or water damage vulnerability based on GIS.

21. The disaster analysis and decision system of claim 20, wherein the analysis module evaluates local disaster vulnerability with real time weather situation per natural disaster type, which comprises hurricane, heavy rainfall and snowfall), and human population density, geography, financial value, and past damage data, and decides special manage area per risky area with vulnerability evaluation.

22. The disaster analysis and decision system of claim 1, wherein the analysis module estimates current status of a river and upstreams of the river according to water level rise of the river with the geographic data.

23. The disaster analysis and decision system of claim 1, wherein the report module shows hurricane course status, wherein the analysis module compares adjacent country's hurricane path, establishes a scenario, and analyzes similar hurricane, wherein the analysis module analyzes vulnerability of an area within the hurricane path, wherein the report module constructs a detail screen for city or other administrative regions.

24. The disaster analysis and decision system of claim 23, wherein the operations of the report module and the analysis module are based on the data from the geographic module, the artificial facilities module, the disaster control facilities module and/or the environmental variable module and the operations are provided for a hurricane monitor area which is 16-25 degree front of the hurricane path.

25. The disaster analysis and decision system of claim 23, wherein the operations of the report module and the analysis module are based on the data from the geographic module, the artificial facilities module, the disaster control facilities module and/or the environmental variable module and the operations are provided for a hurricane alert area which is 25-28 degree front of the hurricane path.

\* \* \* \* \*